(12) United States Patent
Tsai et al.

(10) Patent No.: US 8,987,099 B2
(45) Date of Patent: Mar. 24, 2015

(54) STRUCTURE AND METHOD FOR THERMAL TREATMENT WITH EPITAXIAL SICP THERMAL STABILITY IMPROVEMENT

(75) Inventors: Chun Hsiung Tsai, Xinpu Township, Hsinchu County (TW); Su-Hao Liu, Jhongpu Township, Chiayi County (TW); Tsan-Chun Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 338 days.

(21) Appl. No.: 13/332,011

(22) Filed: Dec. 20, 2011

(65) Prior Publication Data
US 2013/0157431 A1 Jun. 20, 2013

(51) Int. Cl.
| | | |
|---|---|---|
| H01L 21/336 | (2006.01) | |
| H01L 21/268 | (2006.01) | |
| H01L 21/28 | (2006.01) | |
| H01L 29/66 | (2006.01) | |
| H01L 29/51 | (2006.01) | |
| H01L 29/78 | (2006.01) | |

(52) U.S. Cl.
CPC ...... *H01L 29/66545* (2013.01); *H01L 21/2686* (2013.01); *H01L 21/28194* (2013.01); *H01L 29/517* (2013.01); *H01L 29/66628* (2013.01); *H01L 29/66636* (2013.01); *H01L 29/7843* (2013.01); *H01L 29/7847* (2013.01); *H01L 29/7848* (2013.01); *H01L 29/785* (2013.01)
USPC .... 438/299; 438/320; 438/591; 257/E21.444; 257/E21.333

(58) Field of Classification Search
USPC ............ 438/299–320; 257/77, 607, E21.444, 257/E21.056, E21.633, E21.634
See application file for complete search history.

(56) References Cited

U.S. PATENT DOCUMENTS

| | | | | |
|---|---|---|---|---|
| 2007/0196992 A1* | 8/2007 | Xiang et al. | .................. | 438/320 |
| 2008/0197383 A1* | 8/2008 | Giles | .............................. | 257/288 |
| 2009/0278209 A1* | 11/2009 | Noda | .............................. | 257/408 |
| 2012/0171826 A1* | 7/2012 | Kim et al. | ..................... | 438/229 |

* cited by examiner

*Primary Examiner* — Charles Garber
*Assistant Examiner* — Abdulfattah Mustapha
(74) *Attorney, Agent, or Firm* — Haynes and Boone, LLP (57) ABSTRACT

The present disclosure provides a method for making an integrated circuit in one embodiment. The method includes providing a semiconductor substrate having an active region and a first gate stack disposed on the semiconductor substrate in the active region; forming in-situ phosphorous-doped silicon carbide (SiCP) features on the semiconductor substrate and disposed on sides of the first gate stack; replacing the first gate stack with a second gate stack having a high k dielectric material layer; and thereafter performing a millisecond annealing (MSA) process with a thermal profile having a first thermal wavelet and a second thermal wavelet.

20 Claims, 9 Drawing Sheets

STRUCTURE AND METHOD FOR THERMAL TREATMENT WITH EPITAXIAL SICP THERMAL STABILITY IMPROVEMENT

BACKGROUND

A semiconductor wafer is processed in a semiconductor manufacturer to form various integrated circuits (IC). Integrated circuits are formed on a semiconductor substrate that includes various doped features configured to form various IC devices, such as field effect transistors, diode and memory devices. Various semiconductor manufacturing processes are employed to form the semiconductor devices including etching, lithography process, ion implantation, thin film deposition, and thermal annealing. A thermal annealing process is applied to a semiconductor wafer at a particular fabrication stage for a particular purpose, such as diffusion, activation, stressing, densification and so on. The thermal annealing process for that purpose may need a thermal profile different from other thermal annealing processes. However, in the current method of making integrated circuits, the thermal annealing processes offer limited capabilities that may be either too strong or too weak. Accordingly, the thermal annealing process may cause other issues, such as over diffusion, if it is too strong. The thermal annealing process may not be able to achieve the intended annealing purpose if it is too weak. The overall quality of the integrated circuits are degraded thereby. Therefore, there is a need for a method making an integrated circuit to address the issue.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
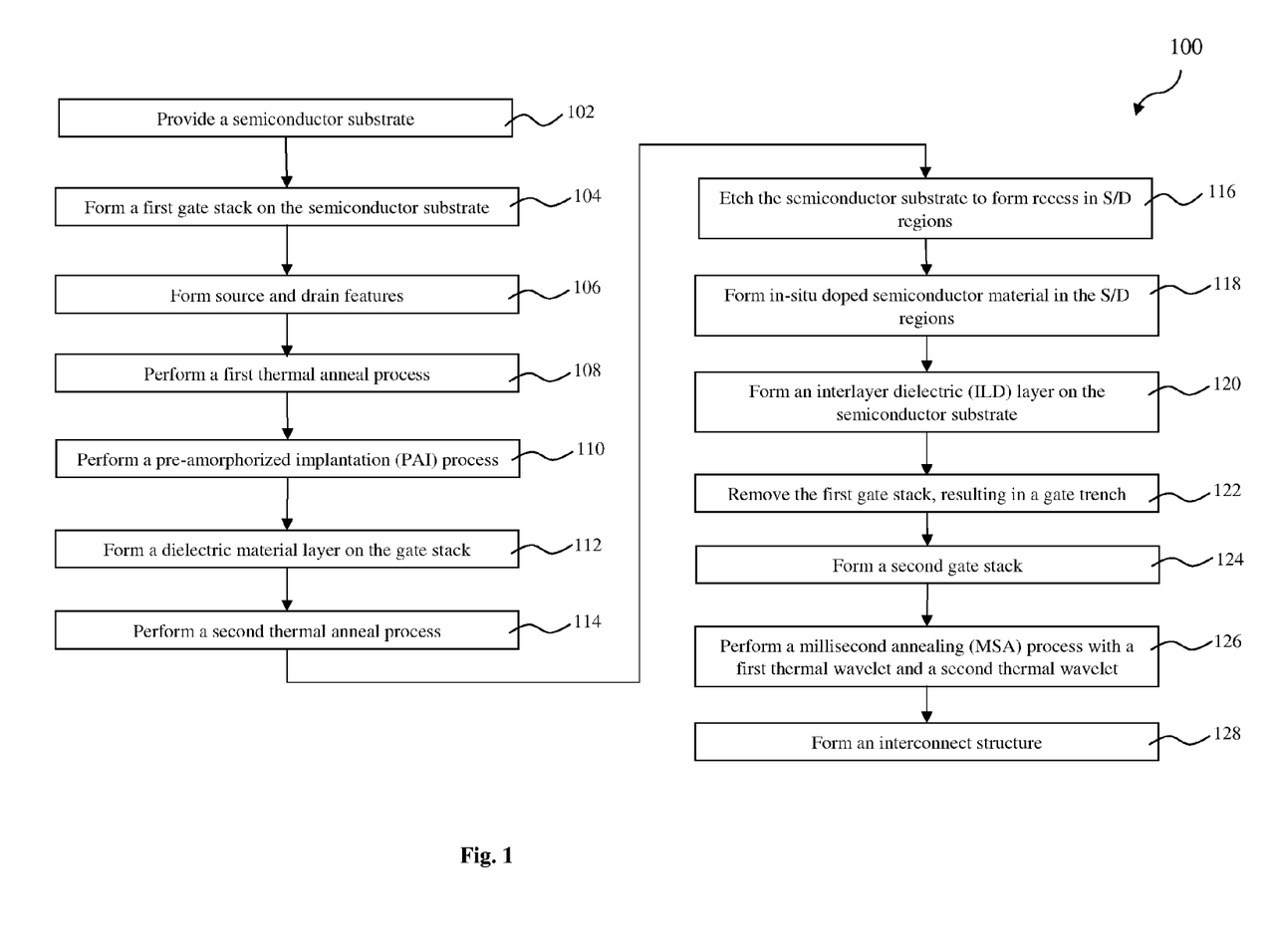
FIG. 1 is a flowchart of a method making a semiconductor structure constructed according to aspects of the present disclosure in one embodiment.

FIG. 1 is a flowchart of an embodiment of a method 100 making a semiconductor structure constructed according to various aspects of the present disclosure. FIGS. 2 through 8 are sectional views of a semiconductor structure 200 constructed according to one or more embodiments. FIG. 9 is a schematic diagram illustrating a millisecond annealing process constructed according to aspects of the present disclosure in one embodiment. The semiconductor structure 200 and the method 100 of making the same are collectively described with reference to FIGS. 1 and 9.

Figure 2:
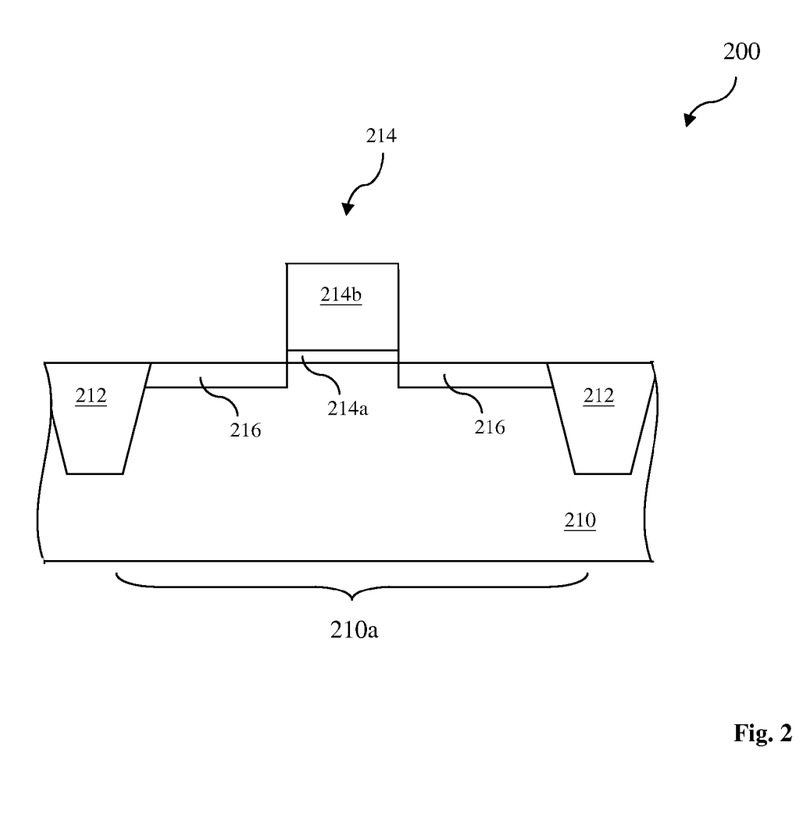
FIGS. 2 through 8 are sectional views of a semiconductor structure at various fabrication stages constructed according to aspects of the present disclosure in one or more embodiments.

Referring to FIGS. 1 and 2, the method 100 begins at step 102 by providing a semiconductor substrate 210. The semiconductor substrate 210 includes silicon. Alternatively or additionally, the substrate 210 includes germanium, silicon germanium or other proper semiconductor materials. The semiconductor substrate 210 also includes various isolation features such as shallow trench isolation (STI) features 212 formed in the substrate to separate various devices. The formation of the STI features may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical planarization (CMP) to etch back, and using nitride stripping to leave the STI structure. In some embodiments, the semiconductor substrate 210 may be a semiconductor on insulator, such as a silicon on insulator (SOI).

The substrate 210 includes an active region 210a for a field effect transistor (FET). In the present embodiment, an n-type field effect transistor (nFET) is to be formed in the active region 210a. In the furtherance of the embodiment, the active region 210a is defined by the STI features 212 and is doped with a p-type of dopant. The doping species include boron (B), boron fluoride (BF2), gallium (Ga) or indium (In). In one example, the active region 210a includes a p-type doped well (p-well). The doped well is formed by a proper technique, such as ion implantation. In one example, the ion implantation is implemented to form the doped well prior to the formation of gate stacks. In alternative example, the nFET is directly formed in the substrate 210 doped with the p-type dopant.

The method 100 proceeds to step 104 by forming a first gate stack 214 in the active region 210a. In one embodiment, the first gate stack 214 includes a first gate dielectric feature 214a and a first gate electrode 214b stacked on the first gate dielectric feature 214a. In one particular example of the first gate stack 214, the first gate dielectric feature 214a includes a silicon oxide or other suitable dielectric material and the first gate electrode 214b includes polysilicon.

The first gate stack 214 is formed by deposition and patterning. In the present embodiment, various material layers are formed by respective deposition technique. For example, silicon oxide is formed on the silicon substrate by thermal oxidation and the polysilicon is formed by chemical vapor deposition (CVD) or other suitable technique.

The deposited material layers are further patterned to form the first gate stack 214 by photolithography process and etch. In the present embodiment, the photolithography process is implemented to form a patterned photoresist (PR) layer having various openings that define the regions wherein the underlying material to be removed. An etch process is then applied to etch the gate material layers using the patterned PR layer as an etch mask. Thereafter, the patterned PR layer is removed by wet stripping or plasma ashing. As an example, the lithography process includes PR coating, exposing, post exposure baking (PEB) and developing. Alternatively, the photolithography process may also be implemented or replaced by other proper methods such as maskless photolithography, electron-beam writing, ion-beam writing, and molecular imprint.

The method 100 proceeds to step 106 by forming various doped features in the semiconductor substrate 210, including source and drain extension (SDE) features 216 in the active region 210a. The SDE features 216 are formed by a proper technique, such as one or more ion implantations. In one embodiment, the SDE features 216 are substantially aligned with the first gate stack 214.

The doping type of the SDE features 216 is opposite from the doping type of the doped well (or the substrate 210) such that the transistor is properly configured. Specifically, the doping type of the doped well includes a p-type of dopant and the SDE features 216 include an n-type dopant. In various examples, the corresponding doping species include phosphorous (P), or arsenic (As).

The method 100 proceeds to step 108 by performing a first thermal annealing process for activation of the SDE features 216. In one embodiment, the first thermal annealing process includes a spike rapid thermal anneal (spike RTA) having an annealing temperature ranging between about 920° C. and about 980° C. In one example, the annealing duration ranges between about 1 second and 5 seconds.

The method 100 may proceed to step 110 by performing a pre-amorphized implantation (PAI) to the S/D regions wherein SDE features 216 are formed. The PAI process injects atoms into the substrate for forming an amorphized region. Silicon and germanium are ion species in two examples. The PAI process introduces energetic doping species into the S/D regions such that the corresponding semiconductor material (silicon in the present embodiment) in the substrate 210 is converted into an amorphous structure. In the present embodiment, germanium (Ge) is the species to be implanted. In one example, the doping dose ranges between about $5\times10^6$ and $5\times10^7$. In another example, the implantation energy ranges between about 25 KeV and about 30 KeV.

Figure 3:
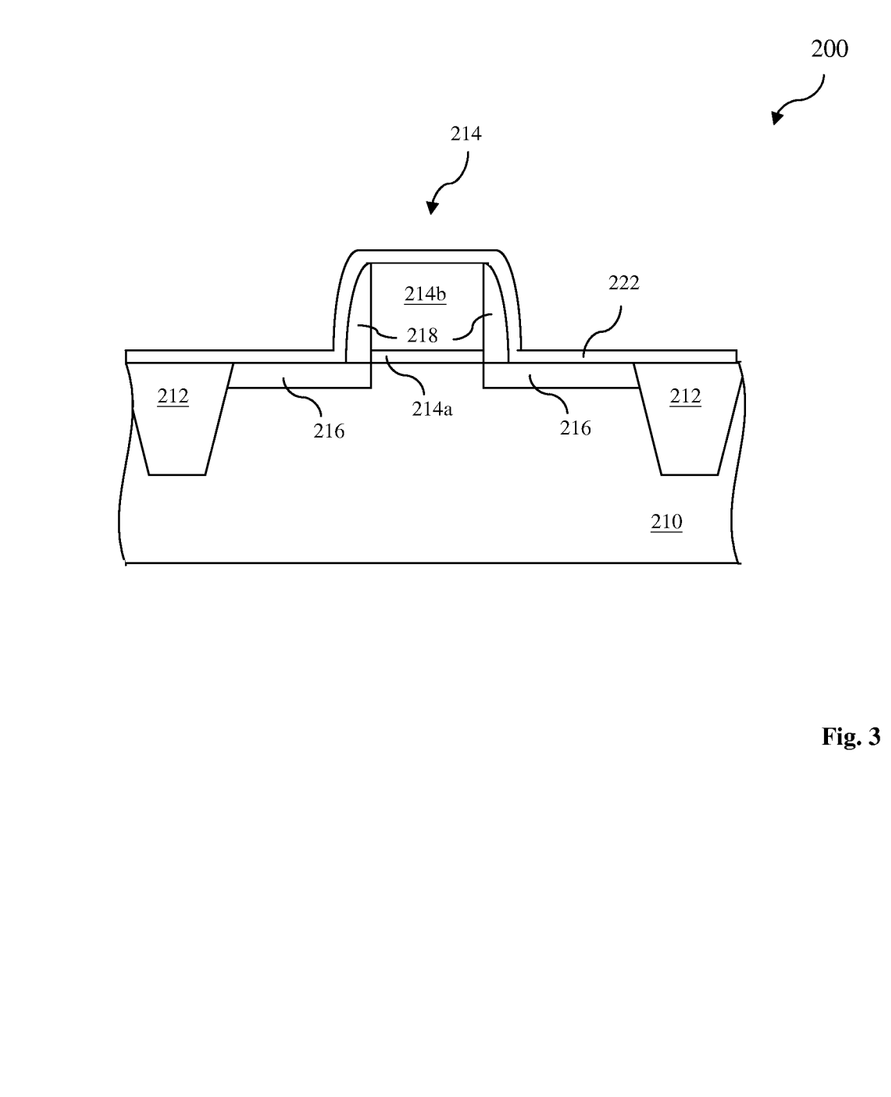

Additionally, gate spacers 218 are formed on the sidewalls of the first gate stack 214 by a suitable process, as illustrated in FIG. 3. As one example, the gate spacers 218 may be formed by a procedure including dielectric material deposition and dry etch. In one example, the deposition utilizes a CVD process. The gate spacer 218 may includes silicon oxide, silicon nitride and/or silicon oxynitride or other suitable dielectric material. In one embodiment, the gate spacers 218 are formed prior to the PAI process such that the pre-amorphized regions are offset from the channel region by the corresponding spacers. In an alternative embodiment, the gate spacers 218 are formed after the completion of the PAI process.

Referring to FIGS. 1 and 3, the method 100 may proceed to step 112 by forming a capping layer 222 on the first gate stack 214 and the substrate 210. In one example, the capping layer 222 includes silicon nitride or other proper dielectric material deposited by a suitable technique, such as CVD. In the present example, the capping layer 222 has a thickness ranging from about 130 angstrom to about 160 angstrom.

The method 100 then proceeds to step 114 by performing a second thermal annealing process. By the second thermal annealing process, the pre-amorphized S/D regions are converted back a crystalline structure through a mechanism referred to as solid phase epitaxial regrowth. A proper stress is frozen in the channel region thereby for enhanced carrier mobility and improved device performance. In the present embodiment for the nFET, a tensile stress is built in the channel region. In one embodiment, the annealing temperature of the second annealing process is greater than that of the first annealing process. In another embodiment, the second thermal annealing process includes a spike RTA having an annealing temperature ranging between about 1000° C. and about 1030° C. In one example, the annealing duration ranges from about 1 second to about 5 seconds.

The procedure including steps 110, 112 and 114 achieves the stressing effect to the channel region for enhanced mobility and device performance through a mechanism of stress memorization technique (SMT). After the second thermal annealing process, the capping layer 222 may be removed by a process, such as wet etching. In one example when the capping layer 222 is silicon nitride, a phosphoric acid solution may be used to remove the capping layer 222.

Figure 4:
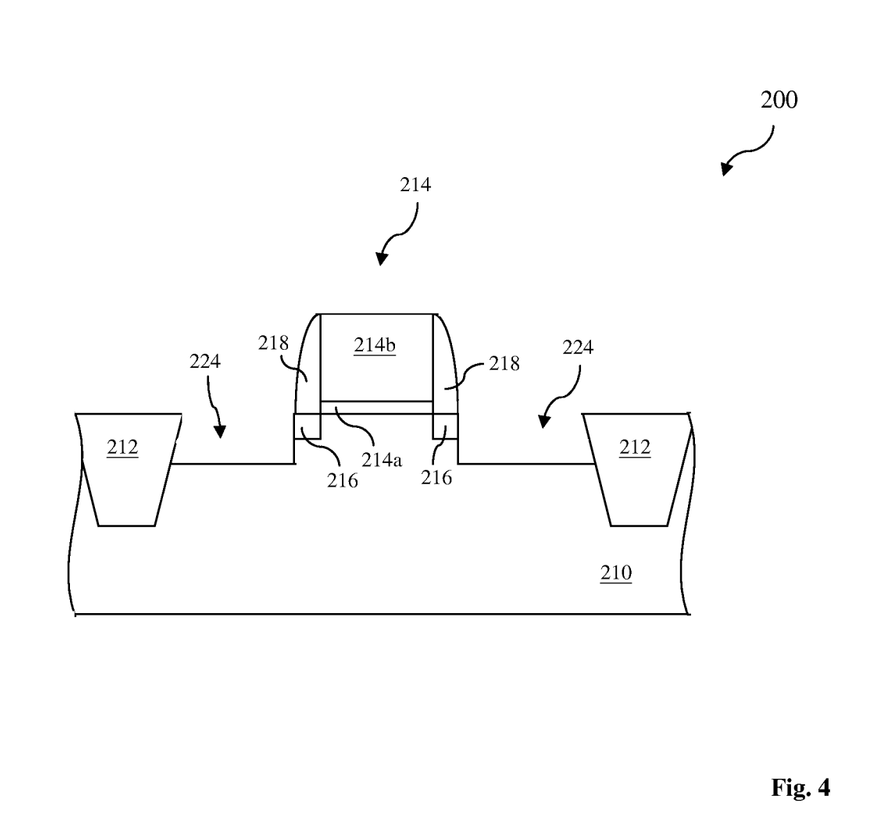

Referring to FIGS. 1 and 4, the method 100 may proceed to step 116 by etching the substrate 210 to form recesses 224 in the S/D regions. In one embodiment, the recesses 224 are offset by the gate spacers 218 from the channel region. In another embodiment, second spacers may be formed on the spacers 218 prior to the recess etch for further offset. In yet another embodiment, the gate spacers 218 are removed and the second spacers are formed on the sidewalls of the gate stack 214 prior to the recess etch.

Figure 5:
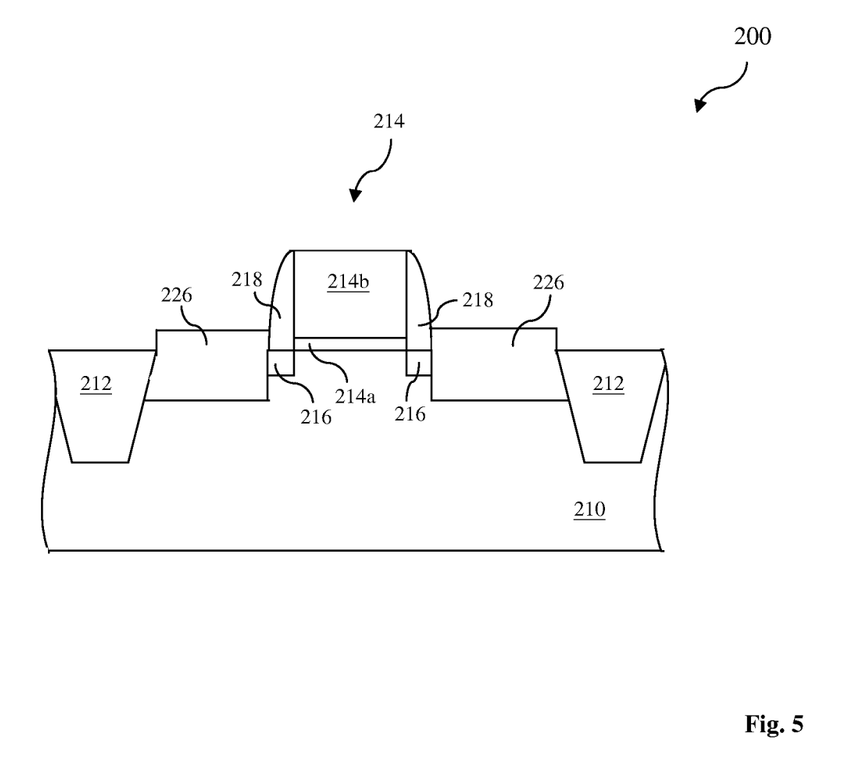

Referring to FIGS. 1 and 5, the method 100 proceeds to step 118 by forming in-situ doped semiconductor material in the S/D regions through epi. growth, resulting in heavily doped source and drain features 226. Instead of introducing the doping species to the S/D regions by an ion implantation, the doping species are introduced into the source and drain features 226 during the epi. growth for higher doping concentration relative to those achieved by the existing methods.

The in-situ doped semiconductor material fills in the recesses 224 in the S/D regions and may further extend above the top surface of the substrate 210. The epi. growth used to form the heavily doped source and drain features 226 uses precursors for the epi. grown semiconductor material and further includes a precursor for the doping species such that the doping species is introduced in situ during the epi. growth.

In the present embodiment, silicon carbide (SiC) is epi grown and is in situ doped with phosphorous (P), also referred to as phosphorous in situ doped silicon carbide (SiCP). The epi growth of SiCP forms in-situ doped source and drain features 226. Those SiCP features, with a lower lattice parameter than that of silicon, generate a tensile strain in the silicon channel, especially when the gate length is less than about 100 nm. In one embodiment, the epi. growth of SiCP utilizes a selective epi growth (SEG) process. The precursors for the SEG process also include the precursor for in-situ phosphorous doping.

In another embodiment, the epi. growth of SiCP utilizes a cyclic deposition etch (CDE) process, forming in-situ doped source and drain features 226. The CDE process includes a plurality of two-step cycles. Each cycle includes a step for deposition and another step for etch. In one example of the CDE process, Si3H4 together with SiCH6 and PH3, are used as precursors for SiCP growth (deposition). Meanwhile, chlorine-based precursors (Cl2 or HCl) are used for selective etch of SiCP on the dielectric-covered area of the substrate. A CVD tool, such as Centura by Applied Materials, may be used for the CDE process.

Figure 6:
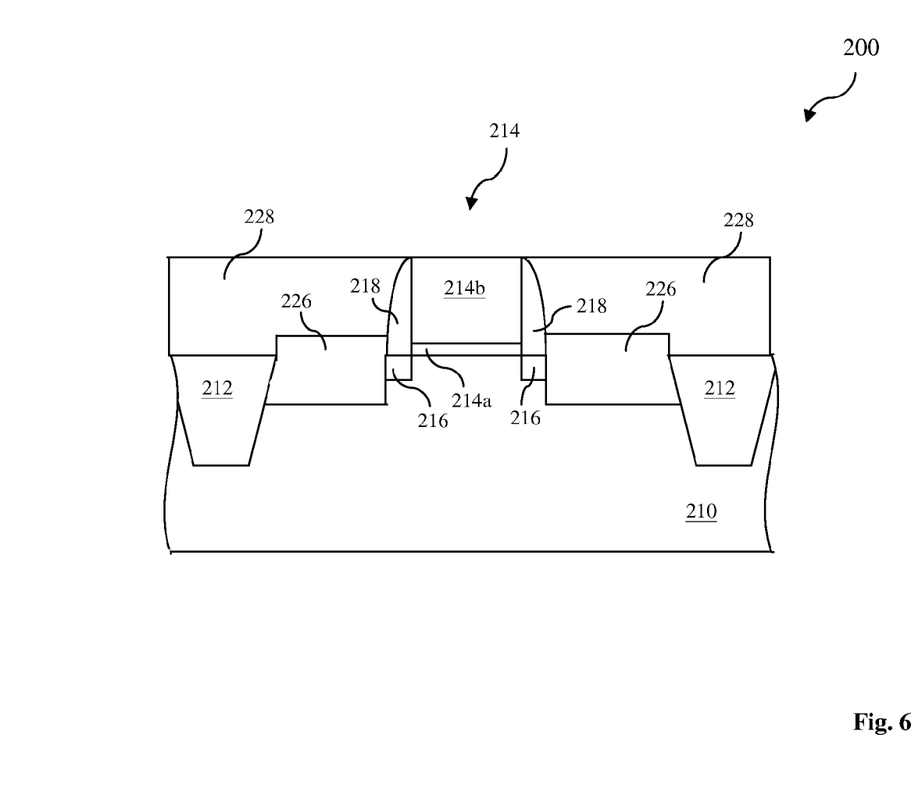

Then a high-k last process may be implemented to form a high-k dielectric metal gate stack. Referring to FIGS. 1 and 6, the method 100 proceeds to step 120 by forming an interlayer dielectric (ILD) layer 228 on the substrate 210. The ILD layer 228 includes silicon oxide, low-k dielectric material or other proper dielectric material. The low-k dielectric material is a dielectric material with dielectric constant less than about 3.9, the dielectric constant of the thermal silicon oxide. The ILD layer 228 is deposited on the substrate 210 and the first gate stack 214 by a suitable technique, such as CVD. For example, a high density plasma CVD may be implemented to form the ILD layer 228. In another example, the ILD layer 228 is formed on the substrate to a level above the top surface of the first gate stack 214. In one embodiment, a chemical mechanical polishing (CMP) process is further applied to the ILD layer 228 to planarize the top surface of the ILD layer 228. In another embodiment, the CMP process may further reduce the thickness of the ILD layer 228 such that the first gate stack 214 is exposed from the top side.

Figure 7:
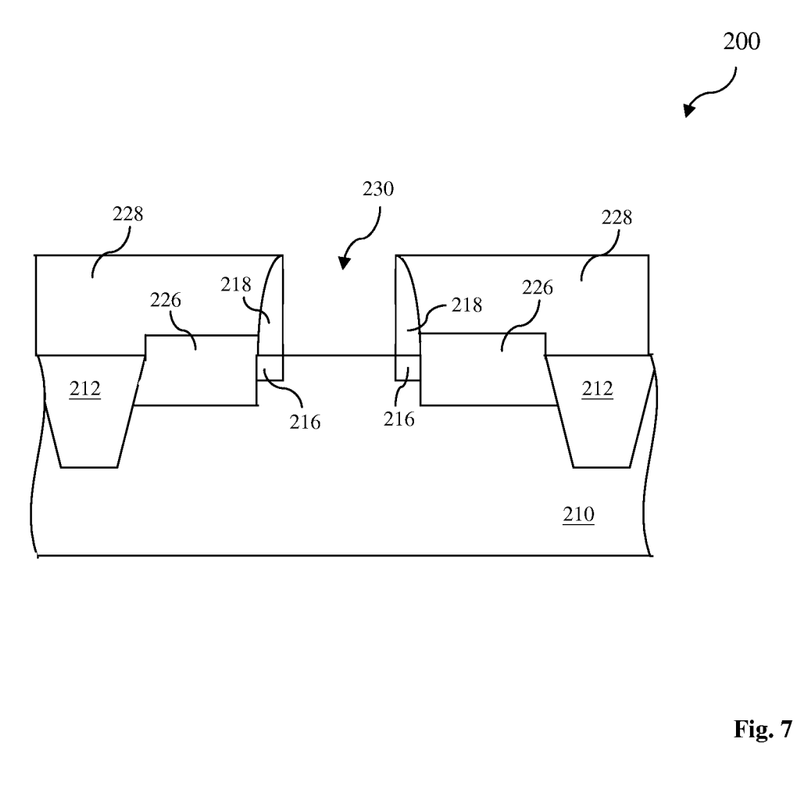

Referring to FIGS. 1 and 7, the method 100 proceeds to step 122 by removing the first gate stack 214, resulting in a gate trench 230. The first gate stack 214 having gate electrode of polysilicon and gate dielectric of silicon oxide may be completely or substantially removed by an etch process. The etch process may include more than one etch steps tuned to selectively remove the polysilicon and/or silicon oxide. In one embodiment, the step 122 may further include a lithography process designed to form a patterned photoresist layer having openings that expose the gate stacks to be removed. In the present example, the patterned photoresist protects the gate stacks for pFETs and expose the gate stacks for nFETs.

Figure 8:
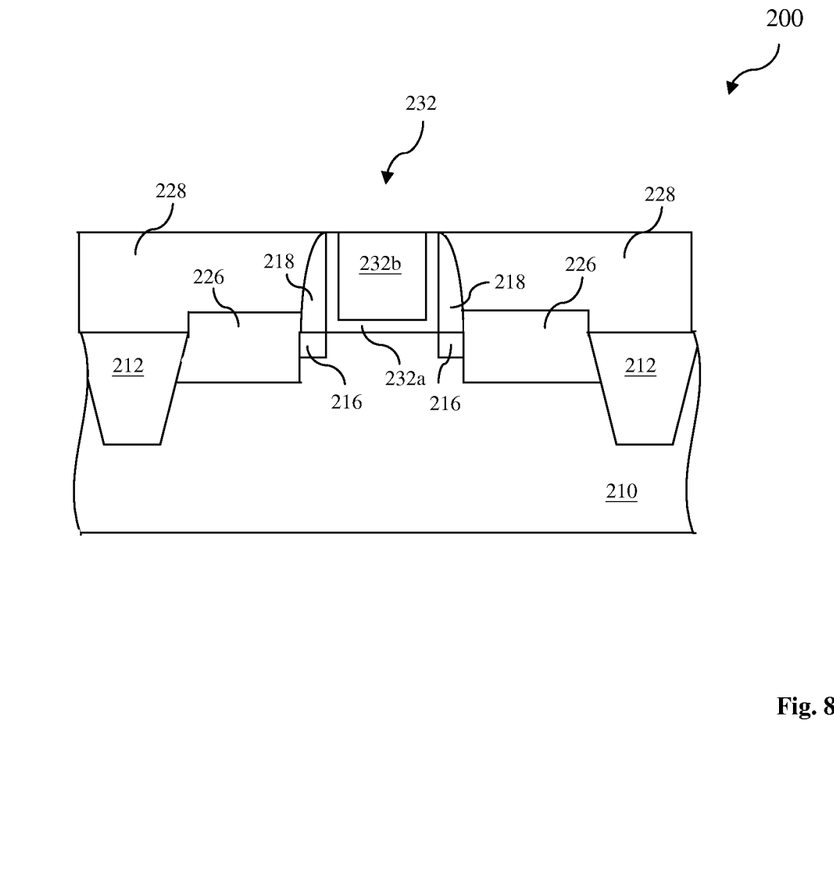
Figure 9:
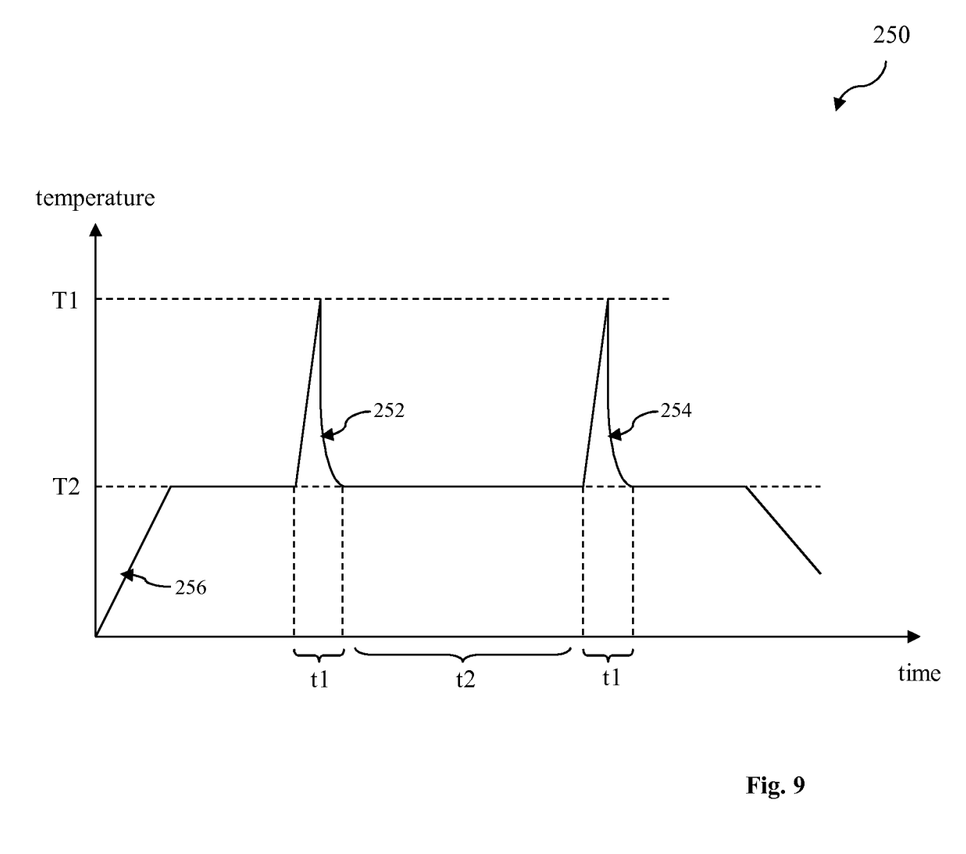
FIG. 9 is a schematic diagram illustrating a millisecond annealing process constructed according to aspects of the present disclosure in one embodiment.

Referring to FIGS. 1 and 8, the method 100 proceeds to step 124 by forming a second gate stack 232 to replace the first gate stack 214. The second gate stack 232 is formed in the gate trench 230. The second gate stack 232 includes a second gate dielectric 232a having a high k dielectric material, referred to as high-k dielectric layer. The high-k dielectric layer 232a includes a dielectric material having the dielectric constant higher than that of thermal silicon oxide, which is about 3.9. In one example, the high-k dielectric layer 232a includes hafnium oxide (HfO). In various examples, the high-k dielectric layer 232a includes metal oxide, metal nitride, or combinations thereof. In another example, the high-k dielectric layer 232a includes a thickness ranging between about 10 angstrom and about 100 angstrom. The high k dielectric layer 232a may be formed by CVD, atomic layer deposition (ALD), plasma enhanced CVD (PE CVD), or plasma enhanced ALD (PE ALD). In another embodiment, the gate dielectric 232a may further include multi-layer dielectric materials, such as an interfacial layer (e.g., silicon oxide) and a high k dielectric material layer disposed on the interfacial layer. In furtherance of the present embodiment, nitrogen may be incorporated into the gate dielectric 232a. For example, nitrogen is incorporated in the interfacial layer of silicon oxide to reduce the gate leakage.

The second gate stack 232 further includes a second gate electrode 232b that disposes on the gate dielectric 232a and fills in the gate trench. The second gate electrode 232b includes one or more metals, also referred to as metal electrode. In one embodiment, the second gate electrode 232b includes a first metal layer having a proper work function (referred to as a work function metal) and a second metal layer (such as aluminum or tungsten) formed on the first metal layer. In furtherance of the present embodiment, the work function metal for nFET (or n-metal) includes a metal-based conductive material having a work function compatible to the nFET. For one example, the work function metal has a work function of about or less than about 4.2 eV. In one example, the n-metal includes tantalum (Ta). The n-metal may include various metal-based films in a stack for optimized device performance and processing compatibility. The n-metal layer can be formed by a suitable process, such as (physical vapor deposition) PVD. A capping layer may be further interposed between the second gate dielectric 232a and the second gate electrode 232b. After the deposition of various gate materials in the gate trench 230, a CMP process may be applied to remove the excessive gate materials and planarize the surface.

The method 100 then proceeds to step 126 to perform a millisecond annealing (MSA) process with a first thermal wavelet and a second thermal wavelet. A MSA process is a thermal annealing process having an annealing duration of about one to several milliseconds. In the present embodiment, the MSA process utilizes a flash lamp annealing technique that uses an array of flash lamps ignited by high voltage pulses to achieve the annealing times in the range of milliseconds. In one example, the flash lamp annealing process utilizes a light radiation of short-wavelength, such as from 0.5 micron to 0.8 micron, to provide the thermal power for the MSA process. In another example, the MSA process is designed to be implemented after the formation of the gate dielectric, especially high k dielectric material. The MSA process is further designed to improve the device performance (such as the performance of the nFET). In one example, the MSA process is performed in a nitrogen environment at the atmosphere pressure.

The MSA process at step 126 includes a first thermal wavelet and a second thermal wavelet as illustrated in FIG. 9. FIG. 9 is a schematic diagram illustrating the thermal profile 250 of the thermal process applied to the semiconductor structure 200 at step 126 according to one embodiment of the present disclosure. In FIG. 9, the horizontal axis represents time and the perpendicular axis represents temperature. The thermal profile 250 includes a first thermal wavelet 252 and a second thermal wavelet 254 sequentially applied to the substrate by the flash lamp annealing technique.

Each thermal wavelet (the first thermal wavelet 252 or the second thermal wavelet 254) has a duration t1 in a range of milliseconds. In one embodiment, the duration t1 is less than about 10 milliseconds. In another embodiment, the duration t1 ranges between about 1 millisecond and about 3 milliseconds. The first and second thermal wavelets 252 and 254 are separated by a charging time t2. The charging time t2 is less than 100 seconds in one example.

Each thermal wavelet (the first thermal wavelet 252 or the second thermal wavelet 254) has a peak temperature T1 higher enough to provide thermal power for activation and reduction of the device instability. On other hand, the thermal power is designed to not significantly enhance the diffusion and reduce the doping concentration of the source and drain features 226. In one embodiment, the peak temperature T1 ranges between about 1000° C. and about 1250° C. In an alternative embodiment, the MSA process may include a third thermal wavelet separated from the second thermal wavelet by another charging time.

In the present embodiment of step 126, a preheating process is applied to maintain the semiconductor structure 200 or a top portion thereof at a certain temperature or a temperature range T2, such as a temperature range between about 500° C. and about 800° C. A preheating process is applied to the semiconductor structure 200 to provide a thermal power tuned such that the substrate temperature is maintained at the temperature range T2 or higher. The preheating process is overlapped with the MSA process. The preheating process begins a few second prior to the MSA process such that the temperature of the semiconductor structure 200 is ramped up to the temperature T2. In the present embodiment, the preheating process is further extended through the charging time between the first and second thermal wavelets of the MSA process. In another embodiment, the preheating process is performed by a RTA system, such as tungsten or halogen lamps. The RTA system for the preheating process and the flash lamp annealing system for the MSA process are integrated to provides a thermal annealing to the high k dielectric layer with a thermal profile 250 as illustrated in FIG. 9 according to one embodiment.

Various advantages may present in different embodiments of the present disclosure. In one example, the disclosed annealing process at step 126 is designed with thermal power and thermal profile enough for activation and effectively reducing the device instability associated with the nFET having the gate stack 232 and the in-situ doped SiC source and drain features 226. On other hand, the annealing process is designed with thermal power in a range with minimized diffusion of the source and drain features 226. Accordingly, the doping concentration of the source and drain features 226 are substantially maintained without significant reduction and the short channel effect is controlled. In another example, the annealing process at step 126 is applied to the high k dielectric material layer for both nFETs and pFETs and is designed to effectively reduce the negative bias temperature instability (NBTI) of the pFETs.

Other processing steps may be implemented before, during and/or after the formation of the semiconductor structure 200 including the nFET. For example, the method 100 may proceed to step 128 by forming a multilayer interconnect (MLI) structure on the substrate 210. The multilayer interconnect structure includes vertical interconnects, such as vias or contacts, and horizontal interconnects, such as metal lines. The various interconnect features may use various conductive materials including copper, tungsten and silicide.

A plurality of contact features may be formed in the ILD layer 228 and are aligned with various contact regions including the source and drain features 226. The formation of the contact features may include etching to form contact holes and filling the contact holes with one or more metal, resulting in metal plugs as contact features.

Thereafter, various metal lines and via features may be formed on the ILD layer 228. The formation of the metal lines and via features may include damascene process (single or dual damascene process), such as those used to form copper interconnect structure. In one example, tungsten is used to form tungsten plugs in the contact holes. The interconnect structure is configured to couple the various devices and circuit features to the input and output signals and power lines.

Even though only one nFET is illustrated in the semiconductor structure 200, the semiconductor structure 200 may include a plurality of nFETs and may further include a plurality of pFETs. In one embodiment, the pFETs also includes a strained structure, such as silicon germanium (SiGe) epi grown in the corresponding source and drain regions. In another embodiment, the gate stacks of the pFETs include high k dielectric material for gate dielectric and metal for gate electrode. The gate stacks of the pFETs may be formed by a gate replacement procedure similar to the gate replacement procedure to form the second gate stack 232 for the nFET. For example, dummy polysilicon gates are formed and then replaced by gate stacks of high k dielectric material and metal materials. The gate stacks of the pFETs may further include a p-metal layer. The p-metal includes a metal-based conductive material having a work function compatible to the pFET. For one example, the p-metal has a work function of about or greater than about 5.2 eV. In one embodiment, the p-metal includes titanium nitride (TiN) or tantalum nitride (TaN).

Although embodiments of the present disclosure have been described in detail, those skilled in the art should understand that they may make various changes, substitutions, and alterations herein without departing from the spirit and scope of the present disclosure. For example, the first thermal annealing process at step 108 or the second thermal annealing process at step 114 is not limited to the spike RTA process and may alternatively use other anneal technique such as flash lamp anneal. In another example, the in-situ phosphorous doped silicon carbide features are formed using a combined CDE/SEG bi-layer process. In the combined CDE/SEG bi-layer process, the CDE and SEG processes are sequentially implemented to form a bi-layer of silicon carbide.

Various metal material layers may be respectively formed by a suitable process. For example, the n-metal layer may be formed by PVD, CVD, plating, ALD, PECVD, PEALD or spin-on metal. In another example, the metal layer of the gate stacks may include aluminum (Al) or tungsten (W). The Al or W layer may be formed by PVD, CVD, ALD, PECVD, PEALD or spin-on metal. In another example, an interfacial layer may be formed by chemical oxide technique, thermal oxide procedure, ALD or CVD. The polysilicon layer may be formed using CVD with precursor silane (SiH4) or other silicon based precursor. In another example, the gate electrode may include metal silicide such as nickel silicide, cobalt silicide, tungsten silicide, tantalum silicide, titanium silicide, or combinations thereof. The gate spacers may have a multi-layer structure and may include silicon oxide, silicon nitride, silicon oxynitride, or suitable other dielectric materials.

The present disclosure is not limited to applications in which the semiconductor structure 200 has a nFET, and may be extended to any other proper integrated circuit. For example, in other embodiments, the semiconductor structure 200 may include a memory device, a sensor device, and/or other microelectronic devices (collectively referred to herein as microelectronic devices). In another embodiment, aspects of the present disclosure are also applicable and/or readily adaptable to any type of transistor, such as FinFET transistors.

Thus, the present disclosure provides one embodiment of a method with thermal treatment for making a semiconductor structure. The method includes providing a semiconductor substrate having an active region and a first gate stack disposed on the semiconductor substrate in the active region; forming in-situ phosphorous-doped silicon carbide (SiCP) features on the semiconductor substrate and disposed on sides of the first gate stack; replacing the first gate stack with a second gate stack having a high k dielectric material layer; and thereafter performing a millisecond annealing (MSA) process with a thermal profile having a first thermal wavelet and a second thermal wavelet.

In one embodiment, the performing a MSA process includes performing a flash-lamp annealing process. In another embodiment, each of the first and second wavelets has a peak duration ranging between about 1 millisecond and about 3 milliseconds. In yet another embodiment, the MSA process includes a charging time between the first thermal wavelet and the second thermal wavelet.

The method may further include performing a pre-heating process that is at least partially overlapped with the MSA process. In one example, the pre-heating process is extended through a charging time between the first thermal wavelet and the second thermal wavelet. In another example, the pre-heating process provides a thermal power tuned according to the charging time such that the substrate temperature is maintained in a temperature range between about 500° C. and about 800° C. In yet another example, the performing a pre-heating process includes implementing a spike rapid thermal annealing (spike RTA) process.

In another embodiment, each of the first and second thermal wavelets in the MSA process includes a peak temperature ranging between about 1000° C. and about 1250° C. In yet another embodiment, the forming an in-situ phosphorous doped silicon carbide features includes implementing one of a cyclic deposition etch (CDE) process and a selective epitaxial growth (SEG) process or a combined CDE/SEG bi-layer process. In yet another embodiment, the replacing the first gate stack with a second gate stack having a high k dielectric material layer includes depositing a interlayer dielectric (ILD) layer on the semiconductor substrate; performing a chemical mechanical polishing (CMP) process to the ILD layer; etching to remove the first gate stack, resulting a gate trench; and depositing the high-k dielectric material layer in the gate trench.

In yet another embodiment, the method further includes implementing a stress memorization technique (SMT) prior to the forming in-situ SiCP features, wherein the SMT includes performing a pre-amorphized implantation (PAI) process to the semiconductor substrate in the active region; depositing a dielectric material layer on the semiconductor substrate and the first gate stack; and performing a thermal annealing process to the semiconductor substrate.

The present disclosure also provides another embodiment of a method with thermal treatment for making a semiconductor structure. The method includes forming a dummy gate stack on a substrate that includes a channel region underlying the dummy gate stack and includes source/drain (S/D) regions interposed by the channel region; forming source and drain extension (SDE) features in the S/D regions; performing a first thermal annealing process to the substrate for SDE activation; etching the substrate in the S/D regions to form recessed regions in the substrate; forming in-situ doped features on the recessed regions; removing the dummy gate stack from the channel region; forming a high k dielectric material layer on the substrate and within the channel region; and thereafter applying, to the substrate, a millisecond annealing process with a thermal profile having a first thermal wavelet and a second thermal wavelet.

In one embodiment, the method further includes performing a pre-amorphized implantation (PAI) process to the substrate in the active region; depositing a dielectric material layer on the substrate and the first gate stack; and performing a second thermal annealing process to the substrate for strained effect. In another embodiment, the first and second thermal annealing processes each include a spike rapid thermal annealing (spike RTA) process.

In another embodiment, the forming in-situ doped features on the recessed regions includes forming in-situ phosphorous-doped silicon carbide (SiCP) features. In yet another embodiment, the millisecond annealing process includes a flash lamp annealing (FLA) process; and the first and second thermal wavelets are separated by a charging time greater than about 10 seconds. In another embodiment, the first and second thermal wavelets each includes a peak temperature ranging between about 1000° C. and about 1250° C. and a time duration less than about 10 milliseconds. In another embodiment, the thermal profile of the millisecond annealing process further includes a third thermal wavelet after the second thermal wavelet separated from the second thermal wavelet by another changing time.

The present disclosure also provides an embodiment of a method of making a semiconductor structure. The method includes forming a dummy gate stack on a semiconductor substrate that includes a channel region and source/drain (S/D) regions interposed by the channel region; etching the substrate in the S/D regions to form recessed regions in the semiconductor substrate; forming in-situ phosphorous doped silicon carbide features on the recessed regions; forming an interlayer dielectric (ILD) layer on the semiconductor substrate and the dummy gate stack; removing the dummy gate stack, resulting in a gate trench in the ILD layer; forming a high k dielectric material layer in the gate trench; and performing a millisecond annealing (MSA) process to the high k dielectric material, wherein the MSA process includes a thermal profile having a first thermal wavelet and a second thermal wavelet separated from the first thermal wavelet by a charging time.

In one embodiment, the method further include forming a gate electrode on the high k dielectric material layer within the gate trench. In another embodiment, the method further includes performing a chemical mechanical polishing (CMP) process to the ILD layer before removing the dummy gate.

In another embodiment, the MSA process includes a flash lamp annealing process; the first and second thermal wavelets each includes a peak temperature ranging between about 1000° C. and about 1250° C. and a time duration less than about 10 milliseconds; and the charging time is less than about 100 seconds. In another embodiment, the method further includes forming source and drain features of an n-type dopant in the S/D regions, wherein the channel region is doped by a p-type dopant. In yet another embodiment, the forming in-situ phosphorous doped silicon carbide features includes a cyclic deposition etch (CDE) process.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a semiconductor substrate having an active region and a first gate stack disposed on the semiconductor substrate in the active region;
forming in-situ phosphorous-doped silicon carbide (SiCP) features on the semiconductor substrate and disposed on sides of the first gate stack;
replacing the first gate stack with a second gate stack having a high k dielectric material layer and a gate electrode; and
after replacing the first gate stack with the second gate stack having the high k dielectric material layer and the gate electrode, performing a millisecond annealing (MSA) process with a thermal profile having a first thermal wavelet and a second thermal wavelet, wherein a portion of the gate electrode is exposed during the performing of the MSA process.

2. The method of claim 1, wherein the performing a MSA process includes performing a flash-lamp annealing process.

3. The method of claim 1, wherein each of the first and second wavelets has a peak duration ranging between about 1 millisecond and about 3 milliseconds.

4. The method of claim 1, wherein the MSA process includes a charging time between the first thermal wavelet and the second thermal wavelet.

5. The method of claim 1, further includes performing a pre-heating process that is at least partially overlapped with the MSA process.

6. The method of claim 5, wherein the pre-heating process is extended through a charging time between the first thermal wavelet and the second thermal wavelet.

7. The method of claim 6, wherein the pre-heating process provides a thermal power tuned according to the charging time such that the substrate temperature is maintained in a temperature range between about 500° C. and about 800° C.

8. The method of claim 6, wherein the performing a pre-heating process includes implementing a spike rapid thermal annealing (spike RTA) process.

9. The method of claim 6, wherein each of the first and second thermal wavelets in the MSA process includes a peak temperature ranging between about 1000° C. and about 1250° C.

10. The method of claim 1, wherein the forming an in-situ phosphorous doped silicon carbide features includes implementing one of a cyclic deposition etch (CDE) process, a selective epitaxial growth (SEG) process and a combined CDE/SEG bi-layer process.

11. The method of claim 1, wherein the replacing the first gate stack with a second gate stack having a high k dielectric material layer includes
depositing a interlayer dielectric (ILD) layer on the semiconductor substrate;
performing a chemical mechanical polishing (CMP) process to the ILD layer;
etching to remove the first gate stack, resulting a gate trench; and
depositing the high-k dielectric material layer in the gate trench.

12. The method of claim 1, further comprising implementing a stress memorization technique (SMT) prior to the forming in-situ SiCP features, wherein the SMT includes
performing a pre-amorphized implantation (PAI) process to the semiconductor substrate in the active region;
depositing a dielectric material layer on the semiconductor substrate and the first gate stack; and
performing a thermal annealing process to the semiconductor substrate.

13. A method, comprising:
forming a dummy gate stack on a substrate that includes a channel region underlying the dummy gate stack and includes source/drain (S/D) regions interposed by the channel region;
forming source and drain extension (SDE) features in the S/D regions;
performing a first thermal annealing process to the substrate for SDE activation;
etching the substrate in the S/D regions to form recessed regions in the substrate;
forming in-situ doped features on the recessed regions;
forming an interlayer dielectric (ILD) layer on the semiconductor substrate and the dummy gate stack;
removing the dummy gate stack from the channel region resulting in a gate trench in the ILD layer,
forming a high k dielectric material layer in the gate trench;
after forming the high k dielectric in the gate trench, applying, to the substrate, a millisecond annealing process with a thermal profile having a first thermal wavelet and a second thermal wavelet, wherein the ILD layer covers the S/D regions during the applying of the millisecond annealing process.

14. The method of claim 13, further comprising a performing a pre-amorphized implantation (PAI) process to the substrate in the active region;
depositing a dielectric material layer on the substrate and the first gate stack; and
performing a second thermal annealing process to the substrate for strained effect.

15. The method of claim 14, wherein the first and second thermal annealing processes each include a spike rapid thermal annealing (spike RTA) process.

16. The method of claim 13, wherein the forming in-situ doped features on the recessed regions includes forming in-situ phosphorous-doped silicon carbide (SiCP) features.

17. The method of claim 13, wherein
the millisecond annealing process includes a flash lamp annealing (FLA) process; and
the first and second thermal wavelets are separated by a charging time greater than about 10 seconds.

18. The method of claim 17, wherein the first and second thermal wavelets each includes a peak temperature ranging between about 1000° C. and about 1250° C. and a time duration less than about 10 milliseconds.

19. The method of claim 17, wherein the thermal profile of the millisecond annealing process further includes a third thermal wavelet after the second thermal wavelet separated from the second thermal wavelet by another changing time.

20. A method of making a semiconductor structure, comprising:
forming a dummy gate stack on a semiconductor substrate that includes a channel region and source/drain (S/D) regions interposed by the channel region;
etching the substrate in the S/D regions to form recessed regions in the semiconductor substrate;
forming in-situ phosphorous doped silicon carbide features on the recessed regions;
forming an interlayer dielectric (ILD) layer on the semiconductor substrate and the dummy gate stack;
removing the dummy gate stack, resulting in a gate trench in the ILD layer;
forming a high k dielectric material layer in the gate trench; and
after forming the high k dielectric material layer in the gate trench, performing a millisecond annealing (MSA) process to the high k dielectric material, wherein the MSA process includes a thermal profile having a first thermal wavelet and a second thermal wavelet separated from the first thermal wavelet by a charging time, wherein the ILD layer covers the S/D regions during the performing of the MSA process.

* * * * *